United States Patent
Shibata et al.

(10) Patent No.: US 11,597,036 B2
(45) Date of Patent: Mar. 7, 2023

(54) OPTICAL MODULE AND MANUFACTURING METHOD THEREOF

(71) Applicant: Fujitsu Optical Components Limited, Kawasaki (JP)

(72) Inventors: Kohei Shibata, Isehara (JP); Tatsuya Ito, Yokohama (JP)

(73) Assignee: FUJITSU OPTICAL COMPONENTS LIMITED, Kawasaki (JP)

(*) Notice: Subject to any disclaimer, the term of this patent is extended or adjusted under 35 U.S.C. 154(b) by 484 days.

(21) Appl. No.: 16/594,828

(22) Filed: Oct. 7, 2019

(65) Prior Publication Data

US 2020/0206842 A1    Jul. 2, 2020

(30) Foreign Application Priority Data

Dec. 27, 2018   (JP) .............................. JP2018-245536

(51) Int. Cl.

| | |
|---|---|
| *B23K 26/08* | (2014.01) |
| *G02B 6/42* | (2006.01) |
| *B23K 26/20* | (2014.01) |
| *H01L 31/18* | (2006.01) |
| *H04B 10/40* | (2013.01) |
| *B23K 103/00* | (2006.01) |
| *B23K 101/40* | (2006.01) |

(52) U.S. Cl.
CPC ............ *B23K 26/206* (2013.01); *H01L 31/18* (2013.01); *H04B 10/40* (2013.01); *B23K 2101/40* (2018.08); *B23K 2103/56* (2018.08)

(58) Field of Classification Search
CPC .. G02B 6/4295; B23K 26/0006; B23K 26/53; B23K 26/0869
See application file for complete search history.

(56) References Cited

U.S. PATENT DOCUMENTS

| | | | |
|---|---|---|---|
| 8,604,383 B2 | 12/2013 | Kuno et al. | |
| 8,993,361 B2 | 3/2015 | Oguri et al. | |
| 9,823,419 B1* | 11/2017 | Pelletier | .................. G02B 6/30 |
| 2004/0002199 A1 | 1/2004 | Fukuyo et al. | |
| 2008/0035611 A1 | 2/2008 | Kuno et al. | |

(Continued)

FOREIGN PATENT DOCUMENTS

| | | |
|---|---|---|
| CN | 1993201 A | 7/2007 |
| CN | 207181751 U | 4/2018 |

(Continued)

OTHER PUBLICATIONS

Office Action, dated Jun. 1, 2021, in corresponding Chinese Application No. 201911043925.3 (21 pp.).

(Continued)

*Primary Examiner* — Caridad Everhart
(74) *Attorney, Agent, or Firm* — Staas & Halsey LLP (57) ABSTRACT

An optical module includes an optical semiconductor chip having a first surface that includes a laser beam irradiation region and a cleavage region, an optical fiber optically coupled to the first surface, and a support member having a second surface bonded to the first surface, and configured to support the optical fiber. The optical semiconductor chip has an optical signal input and output part located in the cleavage region, and the second surface is bonded to the first surface within the cleavage region.

14 Claims, 9 Drawing Sheets

(56) References Cited

U.S. PATENT DOCUMENTS

| | | |
|---|---|---|
| 2014/0015113 A1 | 1/2014 | Kuno et al. |
| 2014/0363905 A1* | 12/2014 | McShane ............... G01M 11/00 |
| | | 324/756.01 |
| 2019/0079253 A1* | 3/2019 | Koumans ............. G02B 6/3652 |

FOREIGN PATENT DOCUMENTS

| | | |
|---|---|---|
| JP | 5-249349 | 9/1993 |
| JP | 2002-192370 | 7/2002 |
| JP | 2006-68816 | 3/2006 |
| JP | 2014-49514 | 3/2014 |
| WO | WO 02/22301 A1 | 3/2002 |

OTHER PUBLICATIONS

Patent Abstracts of Japan English abstract for Japanese Patent Publication No. 2006-68816, published Mar. 16, 2006.
Patent Abstracts of Japan English abstract for Japanese Patent Publication No. 2014-49514, published Mar. 17, 2014.
Patent Abstracts of Japan English abstract for Japanese Patent Publication No. 2002-192370, published Jul. 10, 2002.
Office Action, dated Jun. 7, 2022, in corresponding Japanese Patent Application No. 2018-245536 (6 pp.).

\* cited by examiner

OPTICAL MODULE AND MANUFACTURING METHOD THEREOF

CROSS-REFERENCE TO RELATED APPLICATIONS

This application is based upon and claims the benefit of priority of the prior Japanese Patent Application No. 2018-245536, filed on Dec. 27, 2018, the entire contents of which are incorporated herein by reference.

FIELD

The embodiments discussed herein are related to an optical module and a manufacturing method thereof.

BACKGROUND

As a method of cutting out a plurality of semiconductor chips from a semiconductor wafer, there is a known method that irradiates a laser beam on parts where the semiconductor wafer is to be cut, such as the stealth dicing technique. According to this known method, it is possible to reduce the time required to cut the semiconductor wafer compared to a dicing method.

However, a cut surface of the semiconductor chip obtained by the known method that irradiates the laser beam, is rougher than a cut surface of the semiconductor chip obtained by the dicing method. For this reason, when the semiconductor chip is cut out from the semiconductor wafer using this known method, and an optical fiber is connected to the cut surface by a butt joint, an optical signal is easily attenuated because the optical fiber becomes separated from an input and output part of the semiconductor chip by an amount corresponding to the roughness of the cut surface. In other words, an optical coupling loss becomes large at the butt joint.

Examples of laser beam machining are described in Japanese Laid-Open Patent Publication No. 2002-192370 (now Japanese Patent No. 3408805), and Japanese Laid-Open Patent Publication No. 2006-068816 (now Japanese Patent No. 4197693), for example.

SUMMARY

Accordingly, it is an object in one aspect of the embodiments to provide an optical module and a manufacturing method thereof, which can reduce an optical coupling loss at a butt joint.

According to one aspect of the embodiments, an optical module includes an optical semiconductor chip having a first surface that includes a laser beam irradiation region and a cleavage region; an optical fiber optically coupled to the first surface; and a support member having a second surface bonded to the first surface, and configured to support the optical fiber, wherein the optical semiconductor chip has an optical signal input and output part located in the cleavage region, and wherein the second surface is bonded to the first surface within the cleavage region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be described with reference to the accompanying drawings.

A description will now be given of an optical module and a manufacturing method thereof, according to each embodiment of the present invention. In the drawings, those parts that are functionally the same are designated by the same reference numerals, and a repeated description of the functionally same parts may be omitted.

Structure of Optical Module

Figure 1:
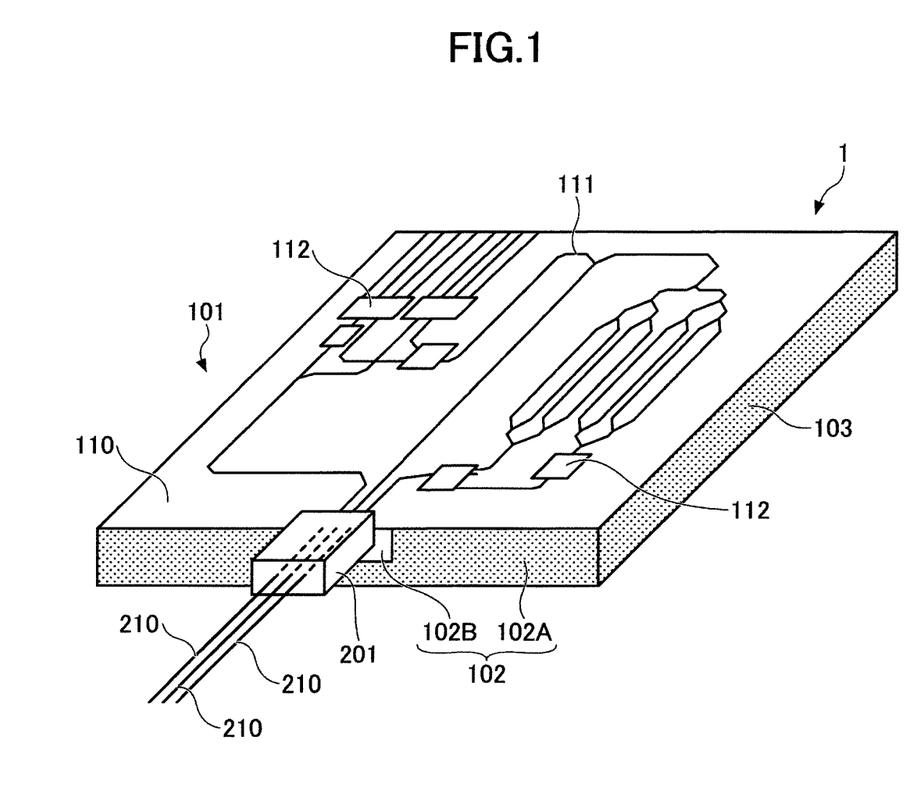
FIG. 1 is a perspective view illustrating a structure of an optical module according to one embodiment.
Figure 2:
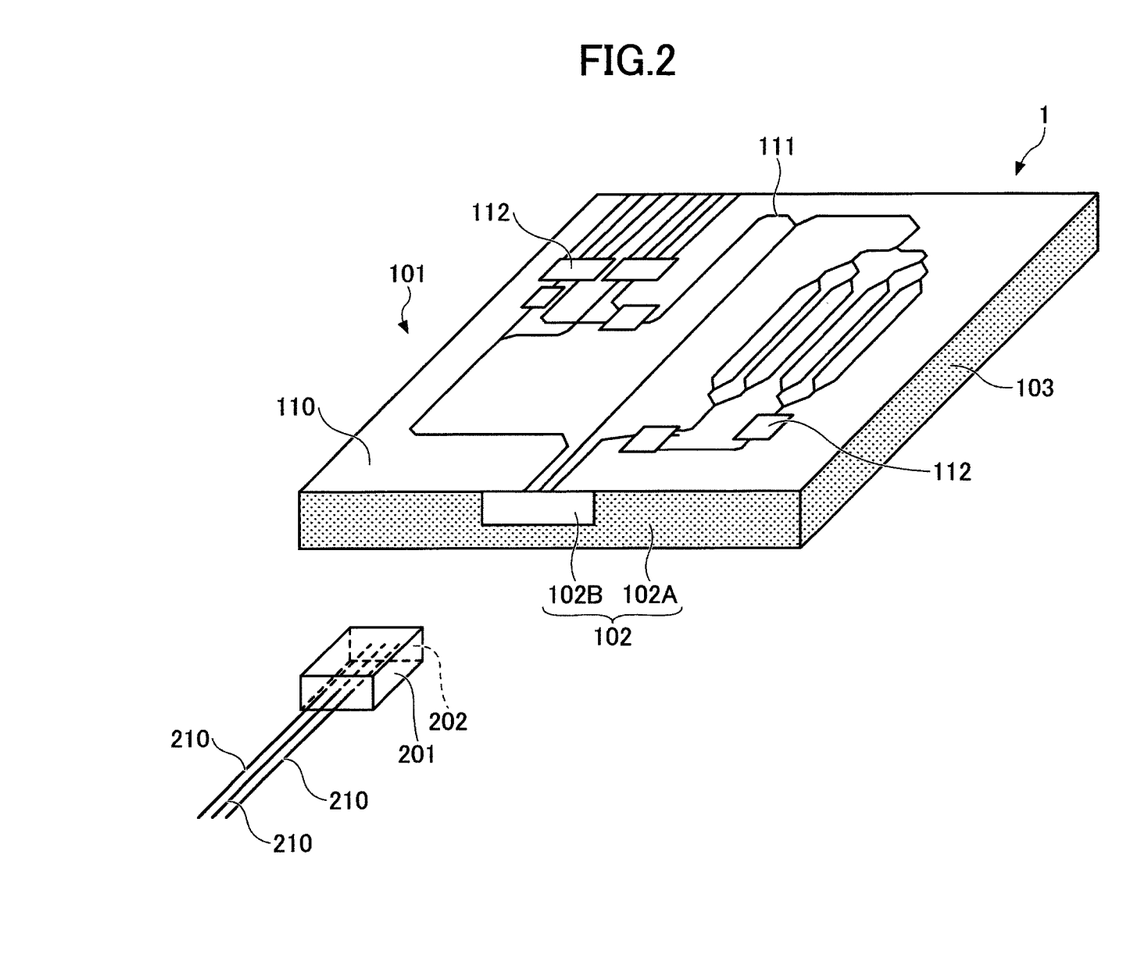
FIG. 2 is a disassembled perspective view illustrating the structure of the optical module according to one embodiment.

First, a structure of an optical module according to one embodiment will be described. FIG. 1 is a perspective view illustrating the structure of the optical module according to one embodiment. FIG. 2 is a disassembled perspective view illustrating the structure of the optical module according to one embodiment.

As illustrated in FIG. 1 and FIG. 2, an optical module 1 according to one embodiment includes an optical semiconductor chip 101, optical fibers 210, and a support member 201. The number of optical fibers 210 is not particularly limited, and may be one or more.

The optical semiconductor chip 101 includes an optical waveguide 111 and an optical device 112 that are formed on a silicon (Si) substrate 110, for example. The optical device 112 includes a photodiode, a deflection beam splitter, a modulator, a mixer, or the like. The silicon substrate 110 has a rectangular planar shape, for example, and an input and output part of the optical waveguide 111 is provided on one side surface 102 of the silicon substrate 110. The side surface 102 is an example of a first surface.

The optical semiconductor chip 101 is cut out from a semiconductor wafer using the stealth dicing technique. The side surface 102 includes a laser beam irradiation region 102A, and a cleavage region 102B. A plurality of focusing points of the laser beam used by the stealth dicing technique are provided in the laser beam irradiation region 102A. A micro-depression, formed by focusing the laser beam at each focusing point, becomes a breakdown starting point. In a case where the laser beam is scanned to focus at a specific depth from a surface of the silicon substrate 110, the micro-depressions in the laser beam irradiation region 102A are formed in a band shape near the specific depth. In addition, in a case where the laser beam is scanned a plurality of times to focus at different depths, the micro-depressions in the laser irradiation region 102A are formed in the band shape near each of the different depths. In other words, the micro-depressions in the laser irradiation region 102A are formed to form a plurality of bands. Although dependent on the laser beam irradiating condition, such as the irradiation energy or the like of the laser beam, a surface roughness Rp in the laser beam irradiation region 102A of the side surface 102 may be 3.5 µm to 5 µm, for example.

The cleavage region 102B includes splits formed by cleavage, and focusing points of the laser beam used by the stealth dicing technique are not provided in the cleavage region 102B. For this reason, unlike the laser beam irradiation region 102A, the micro-depression, formed by focusing the laser beam at each focusing point, is not formed in the cleavage region 102B. The surface roughness Rp in the cleavage region 102B of the side surface 102 may be 0.7 µm to 2 µm, for example. An optical signal input and output part of the optical semiconductor chip 101 is provided in the cleavage region 102B. For example, the input and output part of the optical waveguide 111 is provided in the cleavage region 102B. The cleavage region 102B is provided along one end in a thickness direction of the optical semiconductor chip 101, for example.

The other 3 side surfaces of the optical semiconductor chip 101, such as a side surface 103 connecting to the side surface 102, for example, are formed as the laser beam irradiation region in their entirety. In other words, a plurality of focusing points of the laser beam used by the stealth dicing technique are provided throughout the entire side surface 103. For example, micro-depressions are formed to form a plurality of bands throughout the entire side surface 103, and the surface roughness Rp of the side surface 103 may be 3.5 µm to 5 µm, for example. The remaining 2 side surfaces of the optical semiconductor chip 101 have a configuration similar to that of the side surface 103.

The optical fibers 210 are supported by the support member 201. As illustrated in FIG. 1 and FIG. 2, the support member 201 has a surface 202 that is bonded to the side surface 102. End surfaces of the optical fibers 210 are exposed at the surface 202. In addition, the surface 202 is bonded to the side surface 102 within the cleavage region 102B, and the optical fibers 210 are optically coupled to the input and output part of the optical semiconductor chip 101. In other words, the optical fibers 210 are connected to the optical semiconductor chip 101 by a butt joint. The surface 202 is an example of a second surface.

For example, the support member 201 is bonded to the optical semiconductor chip 101 by an ultraviolet curing adhesive agent. A refractive index of the adhesive agent is preferably approximately the same as a refractive index of the optical fibers 210. A material used for the support member 201 is not particularly limited, but the support member 201 is preferably made of a material that transmits ultraviolet light, to enable efficient curing of the adhesive agent.

In the optical module 1 according to one embodiment, the surface 202 of the support member 201 is bonded to the side surface 102 within the cleavage region 102B, and the optical fibers 210 are optically coupled to the input and output part of the optical semiconductor chip 101. The optical semiconductor chip 101 is cut out from the semiconductor wafer using the stealth dicing technique, for example, but the focusing points of the laser beam are not provided in the cleavage region 102B, and the surface roughness Rp of the cleavage region 102B is considerably small compared to the surface roughness Rp of the laser beam irradiation region 102A. For this reason, the end surfaces of the optical fibers 210 can be arranged in close proximity to the optical signal input and output part of the optical semiconductor chip 101, to reduce the optical coupling loss at the butt joint.

Figure 3:
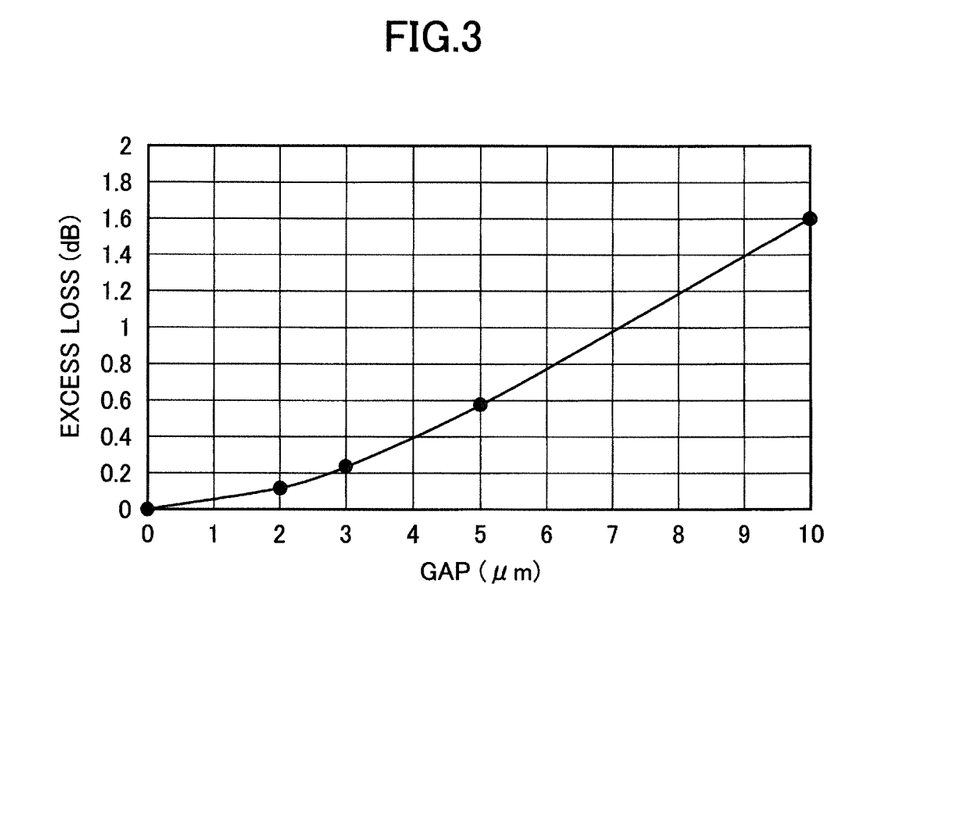
FIG. 3 is a diagram illustrating an example of a tolerance for a case where a mode diameter is 4 μm.

For example, in silicon photonics, a mode diameter obtained by a mode converter is preferably 3 µm or greater, from a viewpoint of manufacturing ease. FIG. 3 is a diagram illustrating an example of a tolerance for a case where the mode diameter is 4 µm. In FIG. 3, the abscissa indicates a gap (µm) between the optical fiber 210 and the input and output part of the optical semiconductor chip 101, and the ordinate indicates an excess loss (dB). As illustrated in FIG. 3, in the case where the mode diameter is 4 µm, the excess loss can be reduced to a tolerable level within 0.5 dB when the gap is 4.5 µm or less. Undesirable effects of the excess loss are unlikely to occur when the excess loss is reduced to the tolerable level. Because the surface roughness Rp in the laser beam irradiation region 102A of the side surface 102 is 3.5 µm to 5 µm, for example, the gap may exceed 4.5 µm in a case where the optical fiber 210 is bonded to the side surface 102 within the laser beam irradiation region 102A. On the other hand, the surface roughness Rp in the cleavage region 102B of the side surface 102 is 0.7 µm to 2 µm, for example. Hence, in the case where the optical fiber 210 is bonded to the side surface 102 within the cleavage region 102B as in this embodiment, it is possible to positively reduce the gap to 4.5 µm or less.

According to this embodiment, the end surface of the optical fiber 210 can be arranged in sufficiently close proximity to the optical signal input and output part of the optical semiconductor chip 101, to reduce the optical coupling loss at the butt joint.

Figure 4:
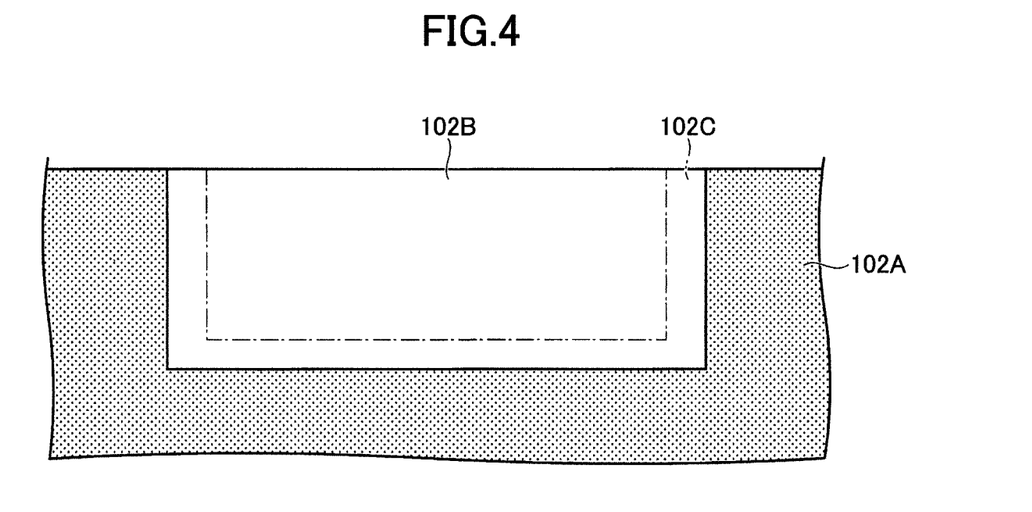
FIG. 4 is a diagram illustrating a distortion region within a cleavage region.

FIG. 4 is a diagram illustrating a distortion region within the cleavage region. As illustrated in FIG. 4, a distortion region 102C, including a distortion generated from a breakdown starting point, may be formed near a boundary between the cleavage region 102B and the laser beam irradiation region 102A, during a cleavage process using the stealth dicing technique. Because a crystal disorder may exist within the distortion region 102C, a loss of the optical signal may occur. For this reason, the optical signal input and output part of the optical semiconductor chip 101 is preferably provided on an inner side of the distortion region 102C, and the surface 202 of the support member 201 is preferably bonded to the side surface 102 on the inner side of the distortion region 102C. In this case, when viewed in a direction perpendicular to the side surface 102, the laser beam irradiation region 102A is located at a position on an outer side of the surface 202 via the distortion region 102C. The distortion region 102C is an example of a buffer region. In other words, the cleavage region 102B includes the distortion region (buffer region) 102C arranged between a region of the cleavage region 102B bonded to the surface 202 of the support member 201, and the laser beam irradiation region 102A.

Materials used for the optical semiconductor chip 101 are not particularly limited. For example, an indium phosphide (InP) substrate or the like may be used in place of the silicon substrate 110. In addition, the shape of the optical semiconductor chip 101 is not particularly limited. The optical semiconductor chip 101 may have a planar shape that is a hexagonal shape, for example. Further, Miller indices of the side surface 102 where the cleavage region 102B is provided are not particularly limited, however, the side surface 102 is preferably a surface that easily forms the cleavage. For example, in the case where the materials used for the optical semiconductor chip 101 include silicon (Si), the Miller indices of the side surface 102 are preferably (110). In the case where the materials used for the optical semiconductor chip 101 include indium phosphide (InP), the Miller indices of the side surface 102 are preferably (110). The side surface 102 of the optical semiconductor chip 101 may be covered by a material having a refractive index that is approximately the same as the refractive index of the optical fibers 210.

In addition, due to the characteristics of the stealth dicing technique, the cleavage region 102B can be provided along one end in the thickness direction of the optical semiconductor chip 101. The size of the cleavage region 102B is not particularly limited, however, the larger the cleavage region 102B becomes, the more difficult it becomes to obtain the individual optical semiconductor chips 101 from the semiconductor wafer. The present inventors confirmed through experimentation that the cleavage region 102B having a sufficiently small surface roughness Rp can be obtained when the size of the cleavage region 102B in a direction perpendicular to the thickness direction is 2.0 mm or less in the silicon substrate 110. In addition, in the thickness direction of the optical semiconductor chip 101, the cleavage region 102B is preferably not formed along the entire thickness direction, and the laser beam irradiation region 102A is preferably formed partially along the entire thickness direction. In this case, it is possible to easily obtain the individual optical semiconductor chips 101 from the semiconductor wafer using the stealth dicing technique.

Figure 5:
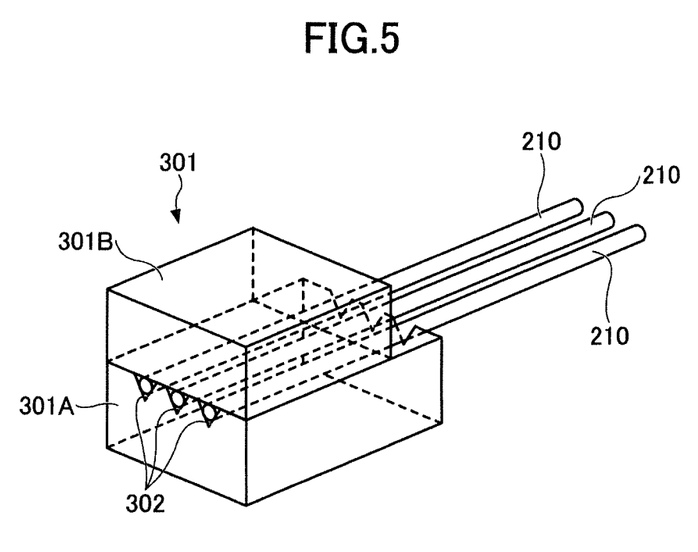
FIG. 5 is a perspective view illustrating another example of a support member.

The shape of the support member 201 is not particularly limited. FIG. 5 is a perspective view illustrating another example of the support member. A support member 301 illustrated in FIG. 5, for example, may be used in place of the support member 201. The support member 301 includes a block 301A having a flat surface, a block 301B having a flat surface contacting the flat surface of the block 301A, and V-shaped grooves 302 formed in the flat surface of the block 301A contacting the flat surface of the block 301B. In this case, the optical fibers 210 are accommodated in the V-shaped grooves 302.

Figure 6:
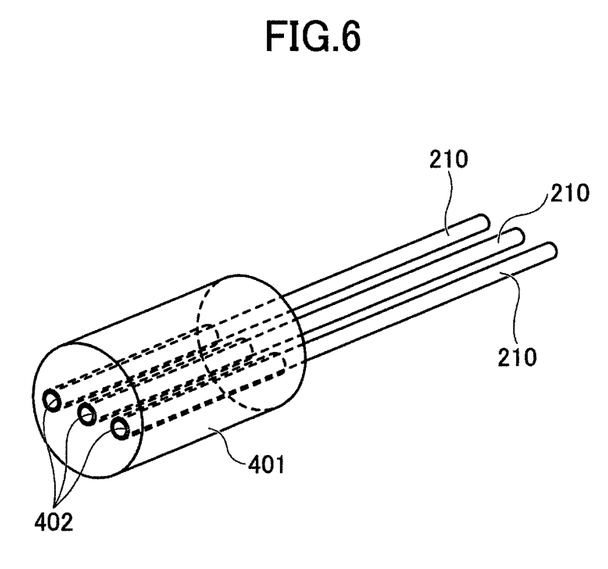
FIG. 6 is a perspective view illustrating still another example of the support member.

FIG. 6 is a perspective view illustrating still another example of the support member. A support member 401 illustrated in FIG. 6, for example, may be used in place of the support member 201. The support member 401 has a cylindrical shape, and includes cylindrical openings 402. In this case, the optical fibers 210 are accommodated in the cylindrical openings 402.

Figure 7:
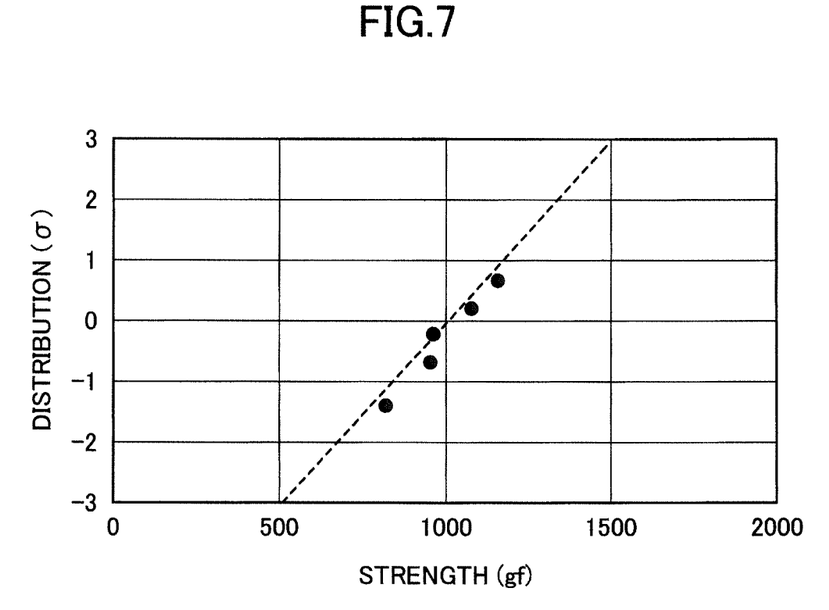
FIG. 7 is a diagram illustrating a distribution of a shearing strength.

Next, experiments related to the strength conducted by the present inventors will be described. The experiments were conducted using a glass support member having a diameter of 1 mm, by copying the cylindrical support member 401 illustrated in FIG. 6. An end surface of the glass support member was bonded to the cleavage region 102B using an ultraviolet curing adhesive agent, and a shearing strength was measured by applying a shearing stress on the glass support member. FIG. 7 is a diagram illustrating a distribution of the shearing strength obtained as a result of this measurement. In FIG. 7, the abscissa indicates the shearing strength (gf), and the ordinate indicates the distribution (σ). In general, the shearing strength of 500 gf is required, but as illustrated in FIG. 7, it was confirmed that a sufficiently large shearing strength is obtainable by the glass support member having the diameter of 1 mm.

Accordingly, by taking into consideration a variation of approximately 10%, the size (width) of the support member in the direction perpendicular to the thickness direction of the optical semiconductor chip 101 is preferably in a range of 0.8 mm to 2 mm.

Method of Manufacturing Optical Module

Figure 8A:
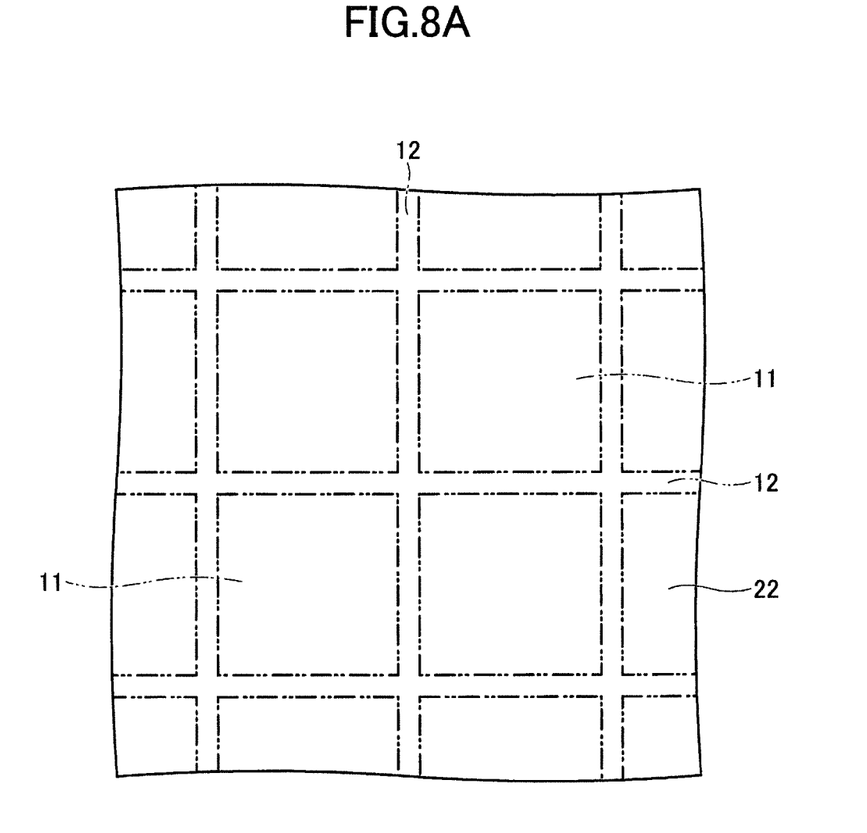
FIG. 8A is a plan view for explaining a method of manufacturing the optical module according to one embodiment.
Figure 8B:
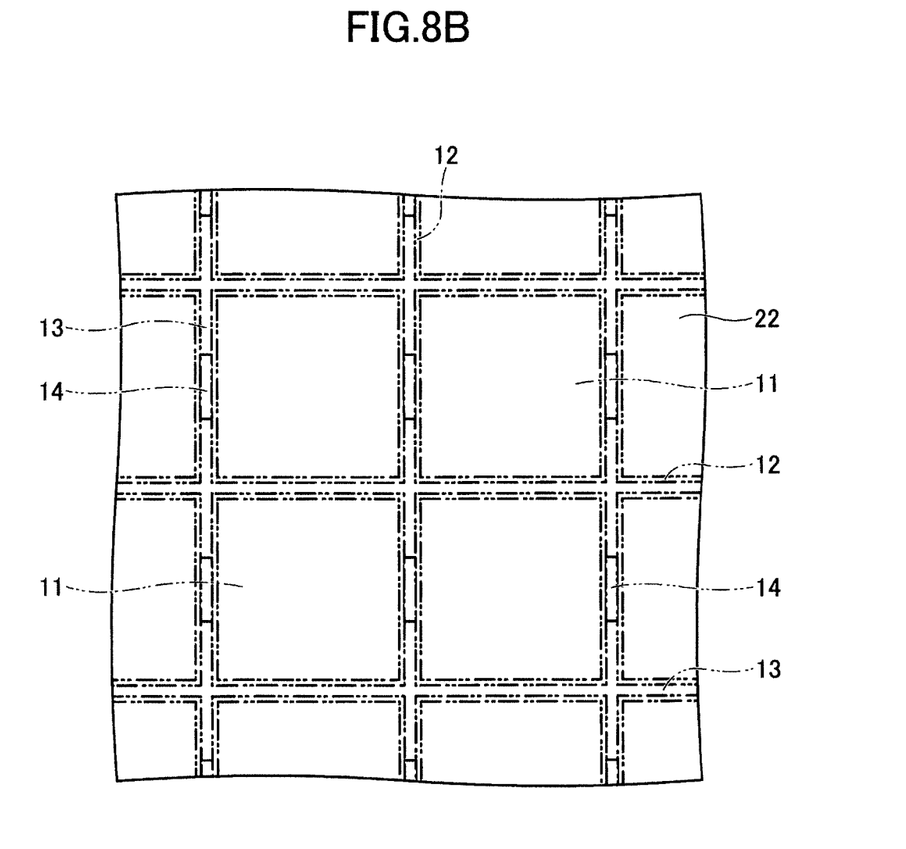
FIG. 8B is a plan view for explaining the method of manufacturing the optical module according to one embodiment.
Figure 8C:
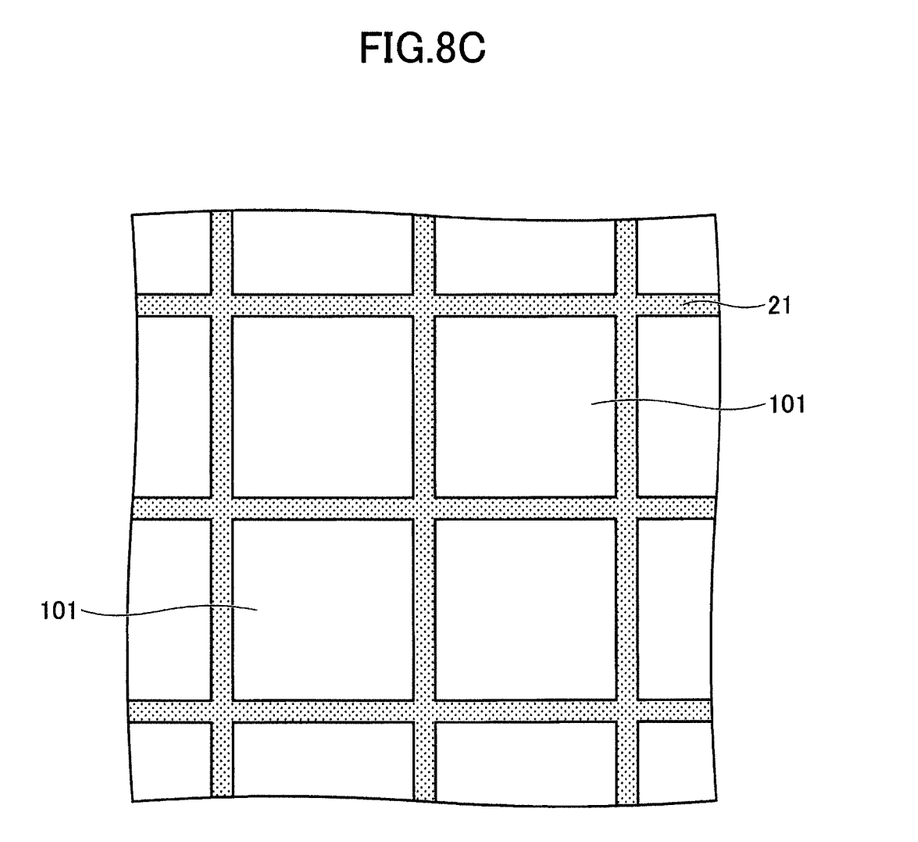
FIG. 8C is a plan view for explaining the method of manufacturing the optical module according to one embodiment.

Next, a method of manufacturing the optical module according to one embodiment will be described. FIG. 8A through FIG. 8C are plan views for explaining the method of manufacturing the optical module according to one embodiment. In addition, FIG. 9 is a perspective view illustrating a semiconductor wafer before stealth dicing.

Figure 9:
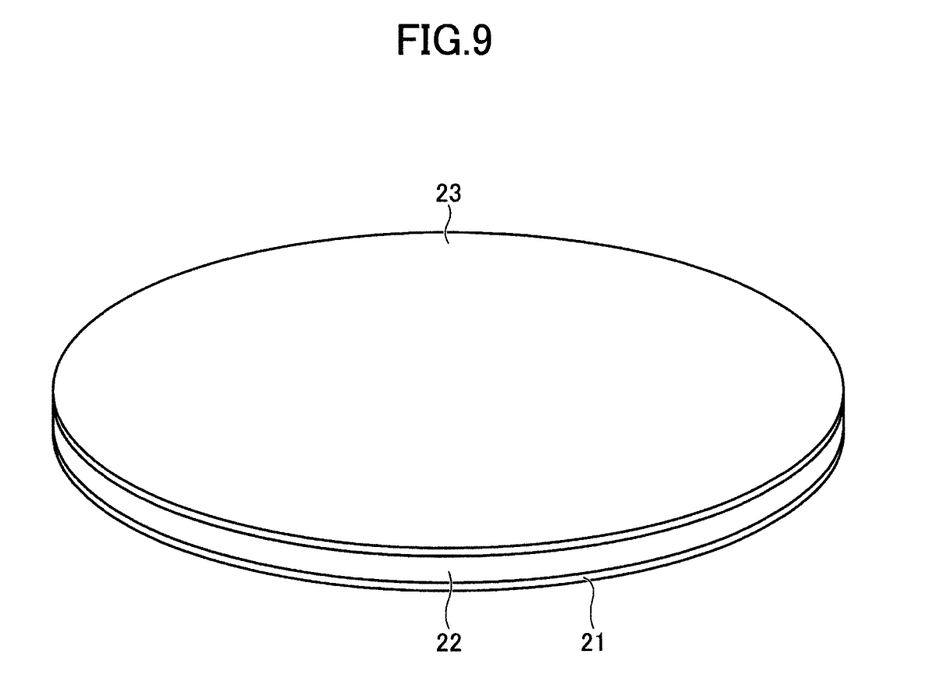
FIG. 9 is a perspective view illustrating a semiconductor wafer before stealth dicing.

First, as illustrated in FIG. 8A and FIG. 9, a semiconductor wafer 22, having a plurality of chip regions 11 arranged in an array, is sandwiched between flexible dicing sheets 21 and 23. The plurality of chip regions 11 are regions where the optical semiconductor chips 101 are formed. In FIG. 8A through FIG. 8C, the illustration of the dicing sheet 23 is omitted for the sake of convenience. The semiconductor wafer 22 has dicing regions 12 that extend vertically and horizontally within a principal plane, to define the chip regions 11.

Next, as illustrated in FIG. 8B, reformed regions 13 are formed on the semiconductor wafer 22 using the stealth dicing technology, by causing a laser beam to scan inside the dicing regions 12 while focusing the laser beam on the semiconductor wafer 22 and moving a focal point inside the dicing regions 12. The reformed regions 13 are formed at a plurality of depths of the semiconductor wafer 22. However, in regions 14 where the cleavage regions 102B are formed, the laser beam is not focused at the depth where the cleavage regions 102B are formed, so as to avoid formation of the reformed regions 13.

Thereafter, the dicing sheets 21 and 24 are stretched together with the semiconductor wafer 22 sandwiched therebetween. As a result, breakdown starts from each focal point of the laser beam, that becomes the breakdown starting point. Hence, as illustrated in FIG. 8C, the semiconductor wafer 22 is separated into individual pieces of the chip regions 11 along borders formed by the dicing regions 12, to form the plurality of optical semiconductor chips 101. In each optical semiconductor chip 101, the laser beam irradiation region 102A is formed at a part corresponding to the reformed region 13, and the cleavage region 102B is formed at a part corresponding to the region 14.

The optical fibers 210 supported by the support member 201 are prepared, separately from the forming of the optical semiconductor chips 101.

Then, the surface 202 of the support member 201 is bonded to the side surface 102 within the cleavage region 102B, and the optical fibers 210 are optically coupled to the side surface 102. In this state, the surface 202 of the support member 201 is preferably bonded to the side surface 102 on the inner side of the distortion region 102C within the cleavage region 102B. In other words, when viewed in the direction perpendicular to the side surface 102, the support member 201 and the optical semiconductor chip 101 are preferably positioned so that the laser beam irradiation region 102A is located at the position on the outer side of the surface 202 via the distortion region 102C.

According to each of the embodiments, it is possible to reduce the optical coupling loss at the butt joint.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical module comprising:
an optical semiconductor chip having an upper surface formed with an optical device, and a side surface provided along one end in a thickness direction of the optical semiconductor chip;
an optical fiber optically coupled to the side surface from an outer side of the optical semiconductor chip; and
a support member having a bonding surface bonded to the side surface from the outer side of the optical semiconductor chip, and configured to support the optical fiber,
wherein the side surface includes a laser beam irradiated surface and a cleavage surface,
wherein the cleavage surface has a first surface roughness smaller than a second surface roughness of the laser beam irradiated surface,
wherein the optical semiconductor chip has an optical signal input and output part located at the cleavage surface, and
wherein the bonding surface of the support member is bonded to an area of the cleavage surface smaller than an entire area of the cleavage surface.

2. The optical module as claimed in claim 1, wherein the laser beam irradiated surface is located at a position on an outer side of the bonding surface when viewed in a direction perpendicular to the side surface.

3. The optical module as claimed in claim 2, wherein the cleavage surface includes a buffer surface arranged between the area of the cleavage surface bonded to the bonding surface, and the laser beam irradiated surface.

4. The optical module as claimed in claim 1, wherein the cleavage surface includes a buffer surface arranged between the area of the cleavage surface bonded to the bonding surface, and the laser beam irradiated surface.

5. The optical module as claimed in claim 2, wherein the cleavage surface is provided along the one end in the thickness direction of the optical semiconductor chip.

6. The optical module as claimed in claim 1, wherein the cleavage surface is provided along the one end in the thickness direction of the optical semiconductor chip.

7. The optical module as claimed in claim 2, wherein the support member is bonded to the optical semiconductor chip by an ultraviolet curing adhesive agent, and the support member transmits ultraviolet light.

8. The optical module as claimed in claim 1, wherein the support member is bonded to the optical semiconductor chip by an ultraviolet curing adhesive agent, and the support member transmits ultraviolet light.

9. A manufacturing method to manufacture an optical module, comprising:
preparing an optical semiconductor chip having an upper surface formed with an optical device, and a side surface provided along one end in a thickness direction of the optical semiconductor chip, wherein the side surface includes a laser beam irradiated surface and a cleavage surface, and the cleavage surface has a first surface roughness smaller than a second surface roughness of the laser beam irradiated surface;
preparing an optical fiber supported by a support member having a bonding surface; and
bonding the bonding surface to and inside an area of the cleavage surface of the side surface smaller than an entire area of the cleavage surface, to optically couple the optical fiber to the side surface from an outer side of the optical semiconductor chip.

10. The manufacturing method to manufacture the optical module as claimed in claim 9, wherein the preparing the optical semiconductor chip includes
focusing a laser beam at a plurality of positions within a first area of a wafer where the laser beam irradiated surface is formed, while avoiding the laser beam to be focused within a second area of the wafer where the cleavage surface is formed, and
performing a cleavage process on the wafer using the plurality of positions as breakdown starting points, to form the laser beam irradiated surface and the cleavage surface on the side surface.

11. The manufacturing method to manufacture the optical module as claimed in claim 9, further comprising:
arranging the laser beam irradiated surface at a position on an outer side of the bonding surface when viewed in a direction perpendicular to the side surface.

12. The manufacturing method to manufacture the optical module as claimed in claim 10, wherein the focusing the laser beam forms micro-depressions within the first area in a band shape near a specific depth of the wafer.

13. The optical module as claimed in claim 1, wherein the laser beam irradiated surface includes micro-depressions formed in a band shape near a specific depth of the optical semiconductor chip.

14. The optical module as claimed in claim 1, wherein other side surfaces of the optical semiconductor chip, other than the side surface, are formed as the laser beam irradiated surface in their entirety.

* * * * *